(12) United States Patent
Tu et al.

(10) Patent No.: US 7,276,766 B2
(45) Date of Patent: Oct. 2, 2007

(54) SEMICONDUCTOR STRUCTURE WITH IMPROVED ON RESISTANCE AND BREAKDOWN VOLTAGE PERFORMANCE

(75) Inventors: Shanghui Larry Tu, Phoenix, AZ (US); James Adams, Tempe, AZ (US); Mohammed Quddus, Chandler, AZ (US); Rajesh S. Nair, Milpitas, CA (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 95 days.

(21) Appl. No.: 11/193,725

(22) Filed: Aug. 1, 2005

(65) Prior Publication Data

US 2007/0023827 A1     Feb. 1, 2007

(51) Int. Cl.
*H01L 29/76* (2006.01)
*H01L 29/94* (2006.01)
*H01L 31/00* (2006.01)

(52) U.S. Cl. .................................... 257/343
(58) Field of Classification Search ................ 257/330, 257/342, 492, 343
See application file for complete search history.

(56) References Cited

U.S. PATENT DOCUMENTS

| 5,294,824 | A | 3/1994 | Okada |
| 5,353,252 | A | 10/1994 | Hashimoto |
| 6,097,063 | A | 8/2000 | Fujihira |
| 6,207,994 | B1 | 3/2001 | Rumennik et al. |
| 6,410,958 | B1 * | 6/2002 | Usui et al. ................. 257/329 |
| 6,479,352 | B2 | 11/2002 | Blanchard |
| 6,555,873 | B2 | 4/2003 | Disney et al. |
| 2003/0132450 | A1 * | 7/2003 | Minato et al. .............. 257/110 |
| 2004/0065934 | A1 * | 4/2004 | Sridevan et al. ........... 257/492 |
| 2007/0023855 | A1 * | 2/2007 | Hossain et al. ............ 257/492 |

* cited by examiner

*Primary Examiner*—Son Dinh
*Assistant Examiner*—Allison P. Bernstein
(74) *Attorney, Agent, or Firm*—Kevin B. Jackson

(57) ABSTRACT

A lateral FET cell is formed in a body of semiconductor material. The lateral FET cell includes a super junction structure formed in a drift region between a drain contact and a body region. The super junction structure includes a plurality of spaced apart filled trenches bounding in part a multiplicity of striped doped regions having opposite or alternating conductivity types.

15 Claims, 10 Drawing Sheets

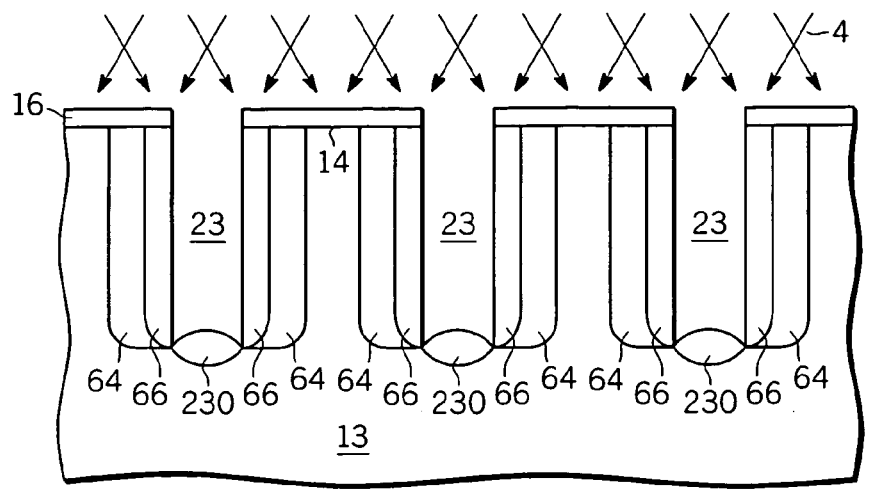
FIG. 3
FIG. 4
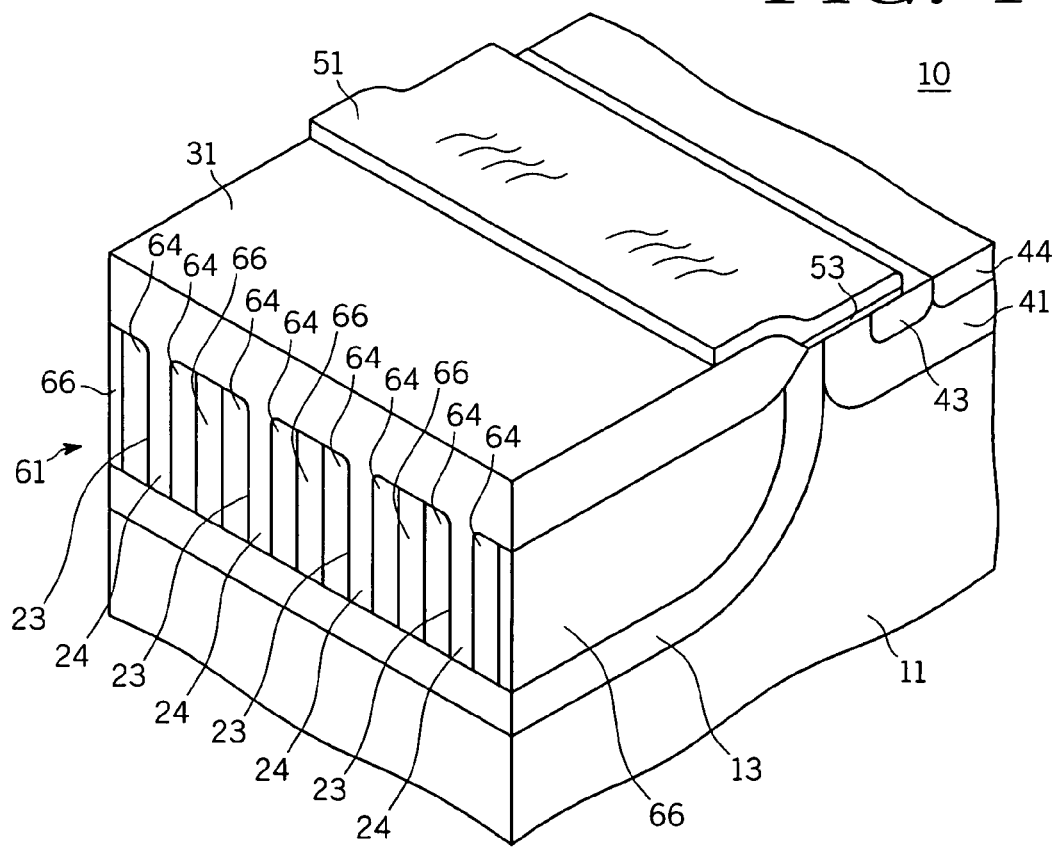

SEMICONDUCTOR STRUCTURE WITH IMPROVED ON RESISTANCE AND BREAKDOWN VOLTAGE PERFORMANCE

FIELD OF THE INVENTION

This invention relates generally to semiconductor devices, and more specifically to power switching structures and methods of manufacture.

BACKGROUND OF THE INVENTION

Metal-oxide semiconductor field effect transistor (MOSFET) such as lateral MOSFETs are often used in high voltage (i.e., greater than 200 volts) applications such as switching device telecommunication systems or as off-line switching regulators in AC to DC voltage converters. In a typical high voltage lateral MOSFET, the source and drain regions are separated by an intermediate or drift region. The gate structure is disposed adjacent to the channel region of the device. In the on state, a voltage is applied to the gate to form a conduction channel region between the source and drain regions, which allows current to flow through the device. In the off state, voltage applied to the gate is sufficiently low so that a conduction channel does not form, and thus current flow does not occur. During the off state, the device must support a high voltage between the source and drain regions.

ON resistance ($R_{ON}$) is an important performance figure of merit for MOSFET switching devices. ON resistance is the ohmic resistance that exists between an input and an output pin of a MOSFET switch when the switch is closed and passing a signal. ON resistance correlates to how much signal attenuation will result as the signal passes through the device. Another important figure of merit is specific on resistance ($R_{sp}$), which is the product of $R_{ON}$ and surface area, or $R_{ON}$*Area. A lower $R_{ON}$*Area allows a designer to use a smaller high voltage lateral MOSFET to meet ON resistance requirements for a given application, which reduces the area and cost of a power integrated circuit.

One problem with conventional high voltage lateral MOSFETs is that techniques and structures that tend to maximize breakdown voltage ($V_{BD}$) adversely affect $R_{ON}$ and vice versa. For example, typical lateral MOSFETs require a lower doping concentration in order to support a higher $V_{BD}$, which increases specific on-resistance ($R_{sp}$).

To overcome this problem, several designs have been proposed in an attempt to provide acceptable combinations of high breakdown voltage and low $R_{ON}$*Area. For example, devices have been designed with one or more reduced surface field (RESURF) regions and/or regions of localized doping (also referred to as super junction or multiple conduction structures). However, these designs require expensive wafer processing involving multiple masking and ion implant steps, very deep diffused body regions or contacts (e.g., 30 to 40 microns deep), and/or expensive silicon on insulator substrates, which increase the cost of chip manufacturing Accordingly, a need exists for cost effective structures and methods that improve the Ron*Area performance of lateral MOSFET devices while maintaining high blocking voltage capability and manufacturing flexibility.

BRIEF DESCRIPTION OF THE DRAWINGS

FIG. 3 illustrates an enlarged partial cross-sectional view of a portion of the semiconductor device of FIG. 1 at an early stage of fabrication;

FIG. 4 illustrates an enlarged partial isometric and cross-sectional view of a portion of the semiconductor device of FIG. 1 in accordance with a second embodiment of the present invention;

DETAILED DESCRIPTION OF THE DRAWINGS

Figure 1:
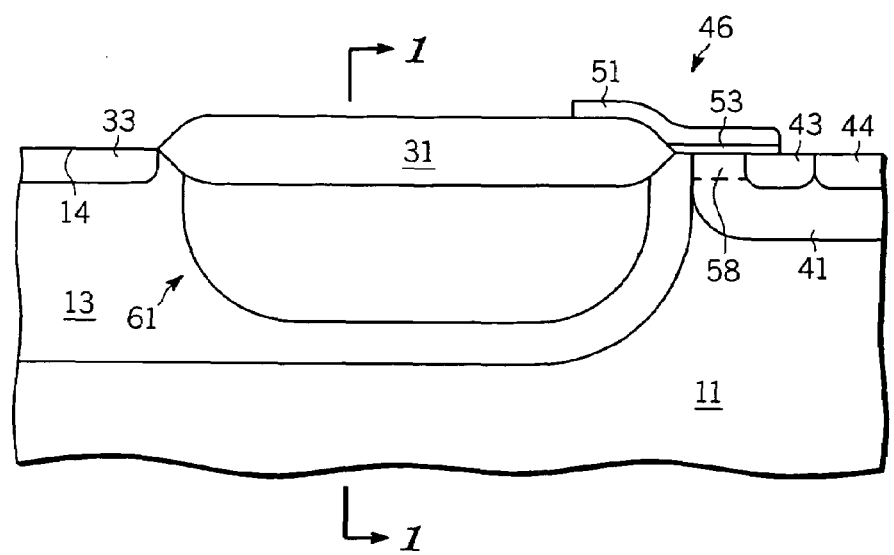
FIG. 1 illustrates an enlarged partial cross-sectional view of a semiconductor device in accordance with the present invention.

For ease of understanding, elements in the drawing figures are not necessarily drawn to scale, and like element numbers are used where appropriate throughout the various figures. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles, and are typically rounded.

Additionally, descriptions and details of well-known steps and elements are omitted for simplicity of the description. Although the devices are explained herein as certain n-channel devices, a person of-ordinary skill in the art will appreciate that p-channel and complementary devices are also possible in accordance with the present invention by making appropriate changes in the conductivity type of the various regions disclosed. The embodiment shown is suitable for a blocking voltage on the order of 700 volts.

FIG. 1 shows a partial cross-sectional view of an insulated gate field effect transistor (IGFET), lateral FET, lateral MOSFET, semiconductor or switching device, structure, or cell 10 having improved $R_{ON}$*Area performance and a high blocking voltage capability in accordance with the present invention. By way of example, MOSFET cell 10 is among many such cells integrated into a semiconductor chip as part of a power integrated circuit. Alternatively, MOSFET cell 10 is a single discrete transistor.

Device 10 includes a region of semiconductor material or substrate 11, which comprises for example, a p-type region or substrate with a doping concentration of about $1.5 \times 10^{14}$ atoms/cm$^3$. Region of semiconductor material 11 includes a major surface 14. Device 10 further includes a well, diffused, drift or extended drain region 13, which in this embodiment comprises an n-type conductivity. Well region 13 is formed in substrate 11 and extends from major surface 14. By way of example, well region 13 has a doping concentration on the order of about $4.0 \times 10^{14}$ to $1.0 \times 10^{16}$ atoms/cm$^3$, and a depth or thickness of about 5 to 15 microns.

Isolation or field regions 31 are formed on, over, in, or overlying device 10 to provide localized areas of passivation. Isolation regions 31 comprise for example, localized oxidation of silicon (LOCOS) regions, shallow trench isolation regions, field oxide regions, combinations thereof, or the like. In one embodiment, isolation regions 31 comprise thermal field oxide regions formed using the LOCOS technique, and have a thickness on the order of 0.5 to 2.0 microns.

Device 10 further includes a p-type high voltage region (PHV), body region or diffused region 41 and an n-type source region 43 extending from major surface 14. Body region 41 extends partially into region of semiconductor material 11. A p-type doped region 44 is further formed in body region 41 and functions, among other things, to reduce parasitic effects within device 10. A drain contact region 33 is formed in a portion of well region 13, and extends from major surface 14. Drain contact region 33 comprises an n-type conductivity, and is doped to provide sufficient ohmic contact. Regions 13, 33, 41, 43, and 44 are formed using conventional masking and doping techniques.

A gate structure 46, which includes a thin gate dielectric layer 53 and a gate electrode 51 is formed adjacent to or overlying a portion of major surface 14 and body region 41. Gate dielectric layer 53 comprises, for example, a silicon oxide having a thickness of about 0.01 to 0.1 microns. Alternatively, gate dielectric layer 53 comprises other dielectrics such as silicon nitride, tantalum pentoxide, titanium dioxide, barium strontium titanate, or combinations thereof including combinations with silicon oxide. Gate electrode 51 comprises, for example, a doped polysilicon, aluminum, an aluminum alloy, combinations thereof, or the like. Gate structure 46 controls the formation of channel 58 and the conduction of current in device 10.

In accordance with the present invention, device 10 further includes a region or super junction structure 61, which comprises a pair, plurality or multiplicity of spaced apart filled trenches, passivated trenches, or filled striped trenches or grooves bounding or confining at least in part (e.g., on two sides), a plurality or multiplicity of striped doped regions having opposite or alternating conductivity types formed in a portion of well region 13.

In one embodiment, the filled striped trenches and the striped doped regions are substantially parallel to each other. Region 61 provides, among other things, device 10 with low on-resistance in a minimal surface area while maintaining a high breakdown voltage. Region 61 is spaced apart from body region 41 a distance, for example, on the order of 1 to 4 microns. Various embodiments for region 61 will now be described in conjunction with FIGS. 2-9.

Figure 2:
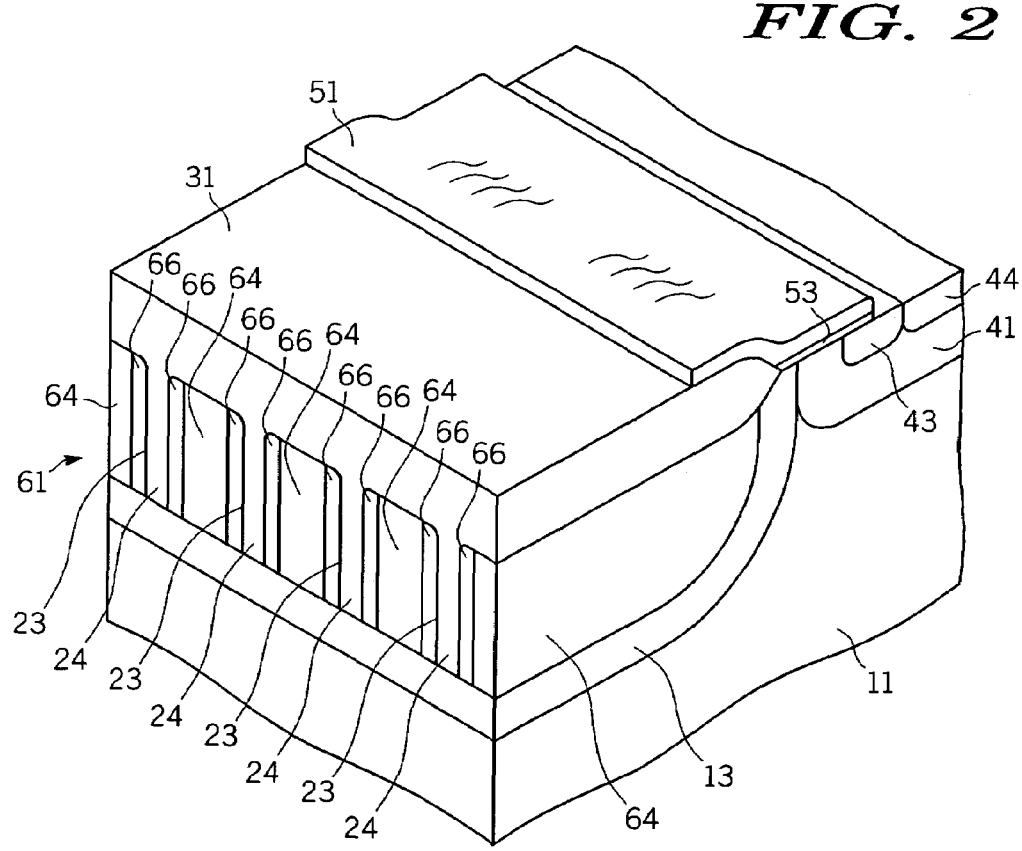
FIG. 2 illustrates an enlarged partial isometric and cross-sectional view of a portion of the semiconductor device of FIG. 1 in accordance with a first embodiment of the present invention taken along reference line 1-1.

FIG. 2 shows an enlarged partial isometric and cross-sectional view of a portion of device 10 taken along reference line 1-1 in, FIG. 1 to illustrate a first embodiment of region 61. In this embodiment, region 61 comprises a plurality of filled trenches bounding a plurality of striped doped regions 64 and 66. Specifically, doped striped region(s) 64 comprises a first conductivity type and is sandwiched between striped doped regions 66 of a second conductivity type. In accordance with this embodiment of the present invention, regions 64 and 66 run the depth direction of trenches 23 along the sidewalls, but these regions do not wrap around the bottom portion or walls of trenches 23. That is, regions 64 and 66 terminate approximately along the sidewall portions of trenches 23, and these regions do not adjoin or abut the bottom surfaces of trenches 23. Regions 64 and 66 have depth that is approximately equal to the depth of trenches 23. In this embodiment, striped regions 64 comprise the same conductivity type as well region 13, but have a higher doping concentration. By way of example, regions 64 have a net peak doping concentration on the order of $1.0 \times 10^{16}$ to $3.0 \times 10^{16}$ atoms/cm$^3$, and regions 66 have a net peak doping concentration on the order of about $1.0 \times 10^{16}$ to $3.0 \times 10^{16}$ atoms/cm$^3$.

FIG. 3 shows a partial cross-sectional view of a portion of device 10 to illustrate the formation of striped doped regions or regions 64 and 66. In this embodiment, trenches 23 are first etched from major surface 14 of device 10 into well region 13. In one embodiment, trenches 23 are spaced a distance on the order of about 2 to 7 microns apart, with the distance being determined by desired RESURF charge requirements. Trenches 23 have a depth that depends on the voltage rating of device 10. By way of example, trenches 23 have a depth on the order of about 8 to 10 microns and a width of about 1 to 2 microns for a device with a $R_{ON}$*Area of 60 mohm*cm$^2$ for a breakdown voltage of about 700 volts. To meet a 700 volt breakdown, the drift length is on the order of about 60 microns. Trenches 23 are formed using conventional photolithographic and etch techniques. By way of example, trenches 23 are etched using dry etching techniques with fluorine or chlorine based chemistry.

Next, a dielectric layer or region of passivation 230 is formed at the bottom of trenches 23. For example, the surface of trenches 23 are first covered with a nitride or masking layer, with the bottom portion subsequently removed using anisotropic etch techniques to expose a portion of well region 13. The exposed portions are then oxidized to form localized regions of passivation 230 as shown at the bottom surfaces of trenches 23. Regions 230 provide a mask or protective layer to prevent regions 64 and 66 from forming along the bottom surfaces of trenches 23. By way of example, regions 230 each have a thickness on the order of about 0.3 to 0.5 microns.

A first conductivity type dopant (e.g., n-type) is then introduced into the sidewalls surfaces of trenches 23. By way of example, angled ion implantation, gas phase doping or solid source doping is used to introduce the doping species into well region 13. FIG. 3 shows an angled implant process as an example where arrows 4 represent a simplified and approximate trajectory of dopant ions. A masking layer 16 prevents dopant ions from reaching major surface 14. In one embodiment, the first conductivity type dopant is then diffused during a thermal process into well region 13 to form first conductivity type regions 64. By way of example, the first conductivity type dopant is diffused for about 30 minutes at 1200 degrees Celsius.

Next, a second conductivity type dopant (e.g., p-type) is introduced into the sidewalls surfaces of trenches 23 (e.g., angled implant, gas phase doping or solid source doping) and then diffused during a thermal process into well region 13 to provide second conductivity type regions 66 as shown in FIG. 2. In one embodiment, first conductivity type dopant that is introduced from adjacent trenches 23 diffuses together to form abutting or adjoining regions 64 as shown in FIG. 2.

By diffusing the first conductivity type dopant first with a subsequent second conductivity type diffused into the first conductivity type region through the sidewall surfaces of trenches 23, well controlled n-type and p-type regions along the depth direction and length of the drift region are achieved. Additionally, by having regions 64 between well region 13 and regions 66, proper charge balancing is achieved as well as improved breakdown voltage characteristics. Regions 64 provide current conduction channels or paths during on state operation. During off state operation, regions 64 and 66 compensate each other to enhance breakdown voltage capability.

In a subsequent step, trenches 23 are filled with a material or dielectric material 24 such as an oxide (thermal, deposited, or spin-on for example), a nitride, semi-insulating polycrystalline silicon (SIPOS), undoped polycrystalline semiconductor material (e.g., polysilicon), combinations thereof, or the like. This provides a super junction structure 61 having a plurality (e.g., a pair) of filled trenches bounding in part (e.g., on two sides) a second conductivity type (e.g., p-type) doped striped region, a first conductivity type (e.g., n-type) doped striped region, and a second conductivity type (e.g., p-type) doped striped region within a first conductivity type (e.g., n-type) well region. In accordance with this embodiment of the present invention, neither the second conductivity type region nor the first conductivity type region wrap entirely around, surround, or abut the bottom surfaces of the filled trenches. In one embodiment, the first and second conductivity type regions and the filled trenches terminate at a depth in the drift region that is substantially equal. In one embodiment, the fill material fills trenches 23 up to or beyond major surface 14.

Simulation analysis of device 10 showed that it is capable of blocking voltages greater than 700 volts while achieving $R_{ON}$*Area results less than 60 mohm*cm$^2$.

FIG. 4 shows an enlarged partial isometric and cross-sectional view of a portion of device 10 taken along reference line 1-1 in FIG. 1 to illustrate a second embodiment of region 61. In the second embodiment, the order of regions 64 and 66 is reversed compared to the first embodiment of FIG. 2. In this embodiment, second conductivity type regions 66 are introduced into the sidewall surfaces of trenches 23 first, followed by the introduction of first conductivity type regions 64 into the sidewall surfaces. This provides a super junction structure 61 having a plurality (e.g., a pair) of filled trenches bounding in part (e.g., on two sides) a first conductivity type (e.g., n-type) doped striped region, a second conductivity type (e.g., p-type) doped striped region, and a first conductivity type (e.g., n-type) doped striped region within a first conductivity type (e.g., n-type) drift region. In accordance with this embodiment of the present invention, neither the second conductivity type region nor the first conductivity type region wrap entirely around, surround, or abut the bottom surfaces of the filled trenches. In one embodiment, the first and second conductivity type regions and the filled trenches terminate at a depth in the drift region that is substantially equal.

Figure 5:
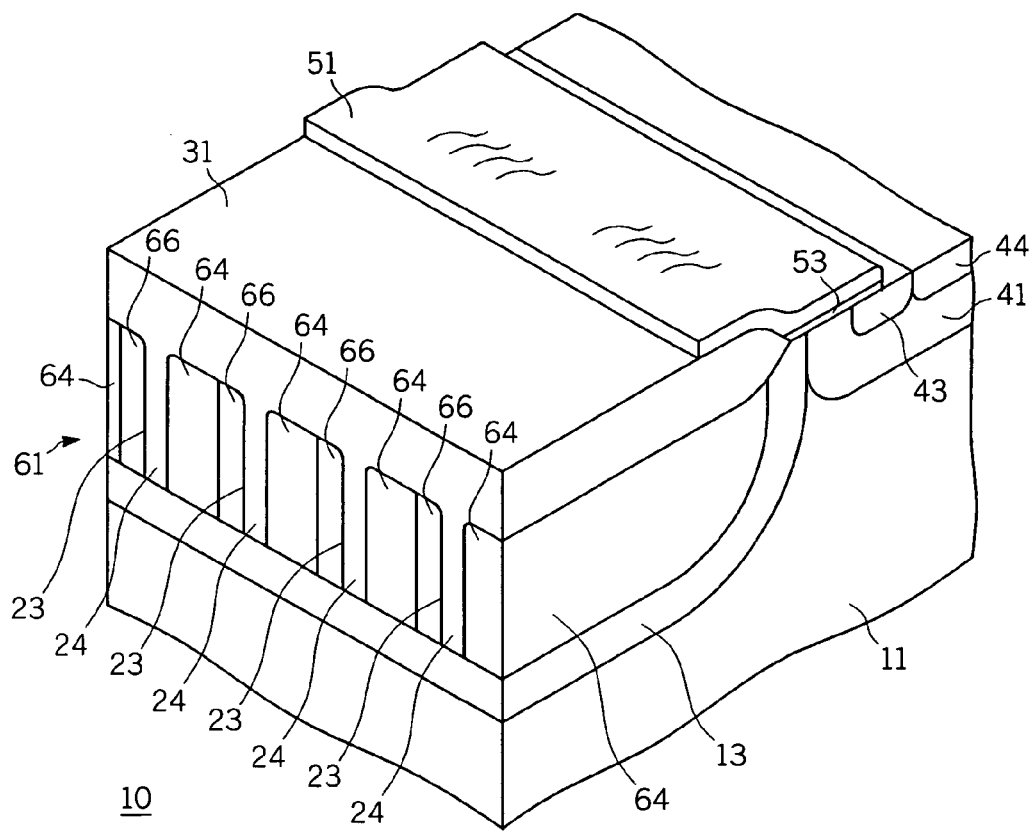
FIG. 5 illustrates an enlarged partial isometric and cross-sectional view of a portion of the semiconductor device of FIG. 1 in accordance with a third embodiment of the present invention.

FIG. 5 shows an enlarged partial isometric and cross-sectional view of a portion of device 10 in accordance with a third embodiment of the present invention. In this embodiment, first conductivity type regions 64 are introduced into one sidewall of trenches 23 while second conductivity type regions 66 are introduced into the other sidewall of trenches 23. This provides a one-sided super junction structure 61 where a first doped striped region (e.g., region 64) is formed adjoining or abutting one of the pair of striped filled trenches, and where the second doped striped region (e.g., region 66) is formed adjoining or abutting another of the pair of striped filled trenches, and where the first doped striped region adjoins the second doped striped region. In accordance with this embodiment of the present invention, neither the second conductivity type region nor the first conductivity type region wrap entirely around, surround, or abut the bottom surfaces of the filled trenches. In one embodiment, the first and second conductivity type regions and the filled trenches terminate at a depth in the drift region that is substantially equal.

Figure 6:
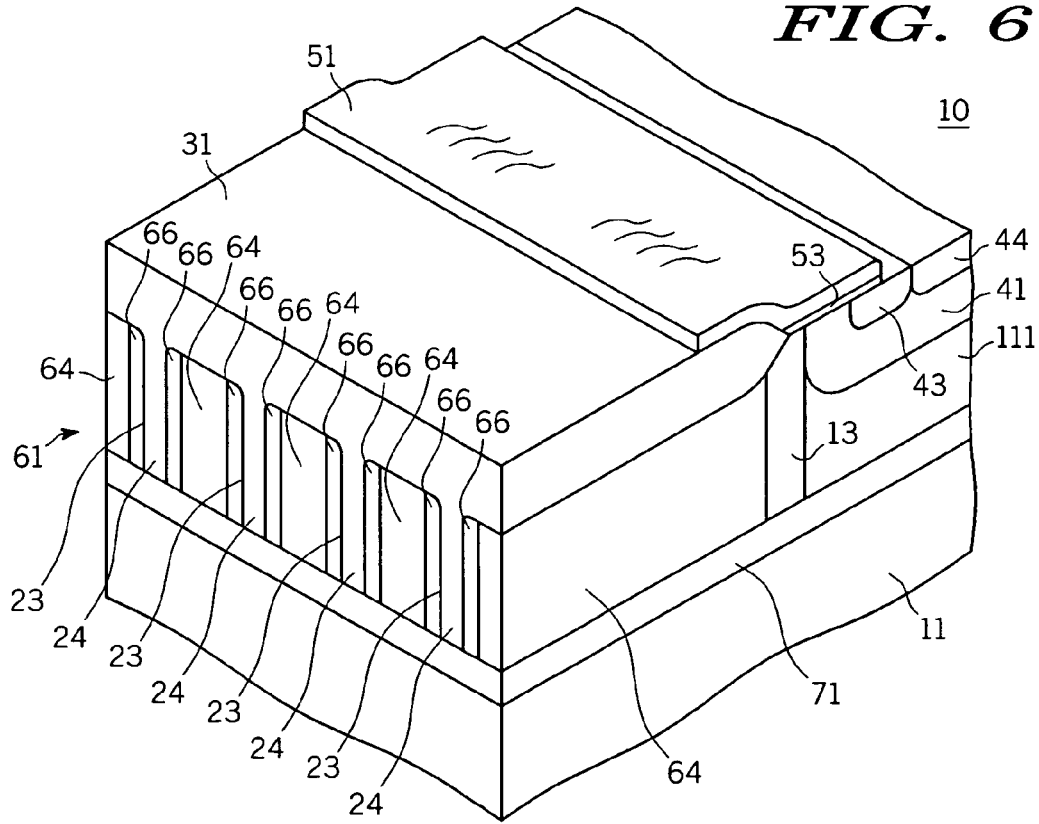
FIG. 6 illustrates an enlarged partial isometric and cross-sectional view of a portion of another embodiment of the present invention.

FIG. 6 shows an enlarged partial isometric and cross-sectional view of a portion of another embodiment of device 10. In this embodiment, an insulating layer or dielectric region 71 is formed in substrate 11 and adjoins or is adjacent to bottom or lower surfaces of trenches 23. In this embodiment, insulating layer 71 separates substrate 11 from a semiconductor layer 111. Region 61 is formed in semiconductor layer 111 as shown, and insulating layer 71 extends beyond well region 13 below body region 41. Although the region 61 embodiment of FIG. 2 is shown, it is understood that any of the region 61 embodiments shown herein, for example, may be used together with insulating layer 71. By way of example, insulating layer 71 comprises an oxide, and has a thickness on the order of about 3 to 4 microns, is formed using high energy ion implantation, or other growth or deposition techniques. Alternatively, an SOI substrate is used.

Figure 7:
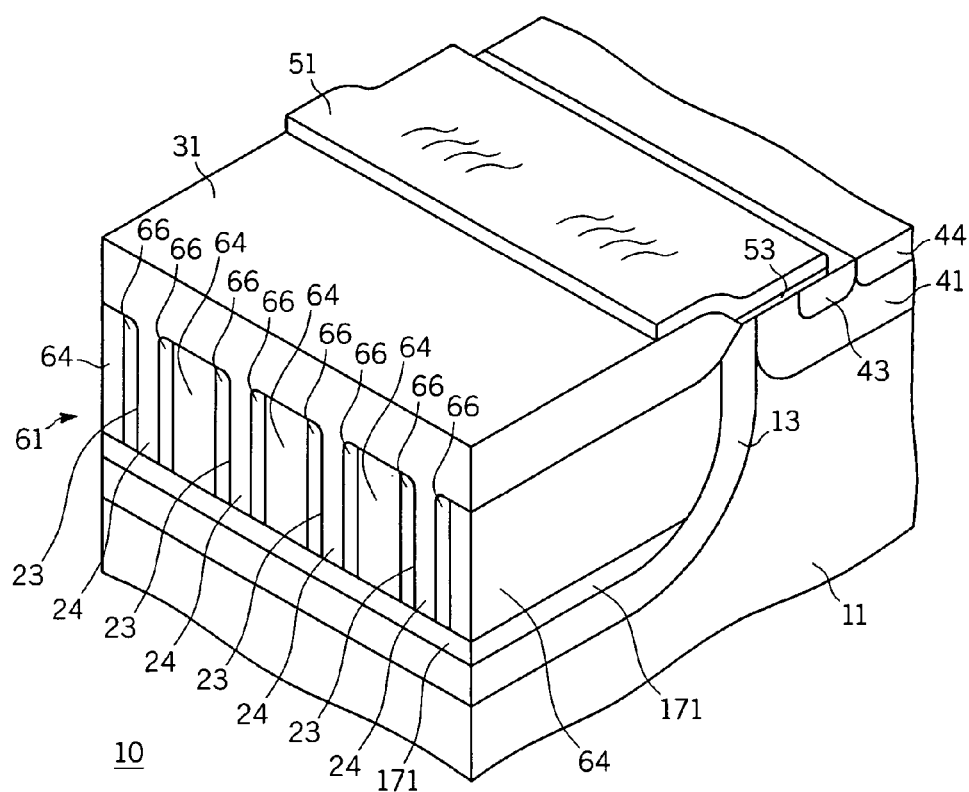
FIG. 7 illustrates an enlarged partial isometric and cross-sectional view of a portion of a further embodiment of the present invention.

FIG. 7 shows an enlarged partial isometric and cross-sectional view of a portion of a further embodiment of device 10. In this embodiment, a localized insulating layer or localized dielectric region 171 separates the bottom portion of region 61 from well region 13. Specifically, insulating layer 171 is formed or confined within well region 13, and is formed using etch/epitaxial growth refill techniques, or high energy ion implant techniques.

Figure 8:
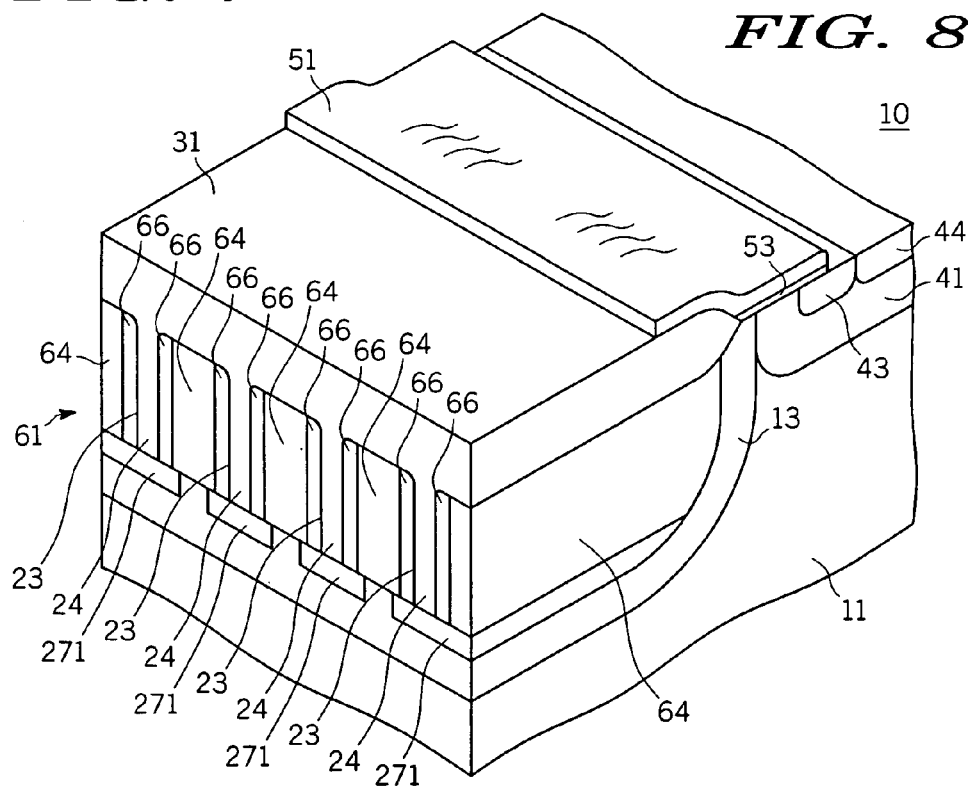
FIG. 8 illustrates an enlarged partial isometric and cross-sectional view of a portion of a still further embodiment of the present invention.

FIG. 8 shows an enlarged partial isometric and cross-sectional view of a portion of a still further embodiment of device 10. In this embodiment, localized regions of passivation or localized dielectric regions 271 run the transverse direction of trenches 23 below and adjacent to the bottom surfaces each trench. In this embodiment, portions of well region 13 laterally separate adjacent localized regions of passivation 271. By way of example, regions 271 are formed using isotropic etching after trenches 23 are formed, which forms cavities underneath trenches 23. The cavities are then oxidized. In one embodiment, regions 271 are confined or formed within well region 13. Additionally, other embodiments include only a portion of trenches 23 having a localized region of passivation 271 regions adjacent thereto.

Figure 9:
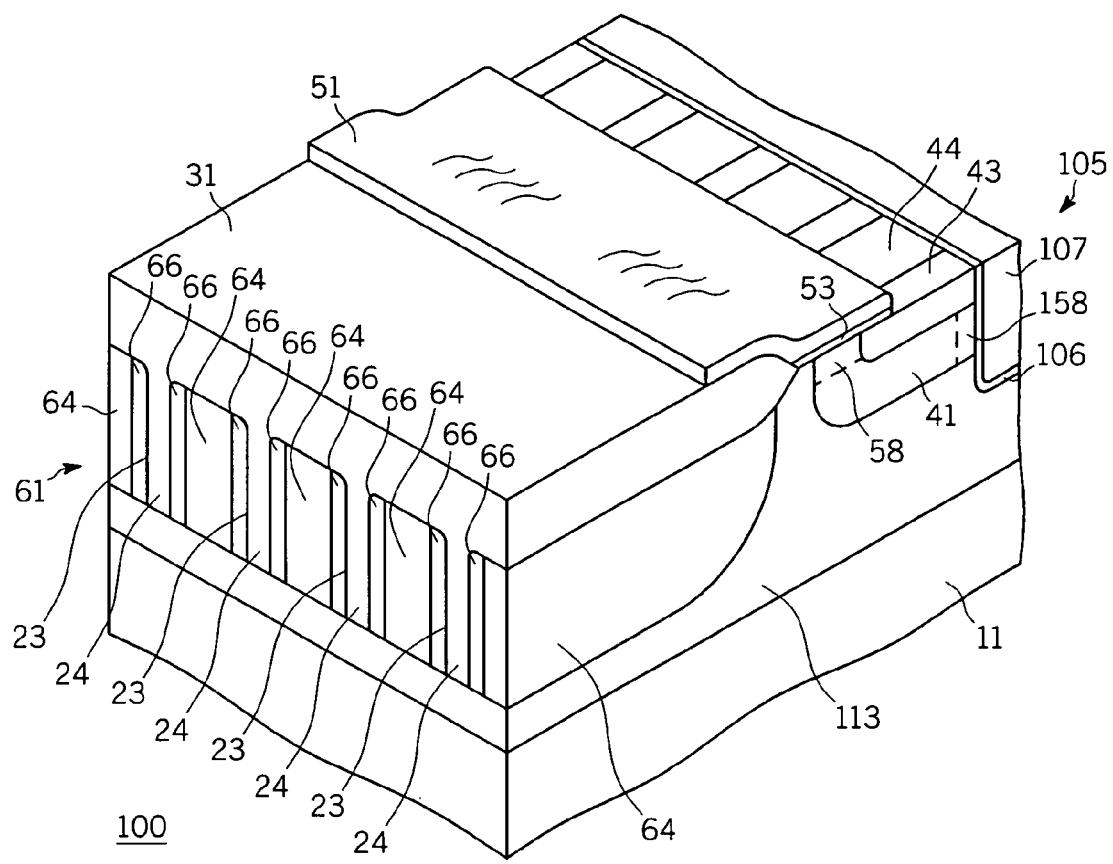
FIG. 9 illustrates an enlarged partial isometric and cross-sectional view of a portion of an additional embodiment of the present invention.

FIG. 9 shows an enlarged partial isometric and cross-sectional view of a portion of an additional embodiment of the present invention designated as device 100. Device 100 is similar to device 10 except for the addition of trench gate structure 105, which is on a side of body region 41 opposite to region 61 as shown. In this embodiment, well region 113 extends under the active device including body region 41 and trench gate structure 105. Trench gate structure 105 includes a gate dielectric layer 106 and a conductive electrode 107 formed overlying gate dielectric layer 106. Gate dielectric layer comprises the same material as gate dielectric layer 53 or another material. Trench gate structure 105 provides, among other things, a vertical channel 158 to help minimize current crowding in channel 58 at the surface. It further provides more optimum use of region 61. In the embodiment shown, super junction region 61 from FIG. 2 is provided as an example. It is understood that the other super junction embodiments shown herein can be incorporated with trench gate structure 105.

Figure 10:
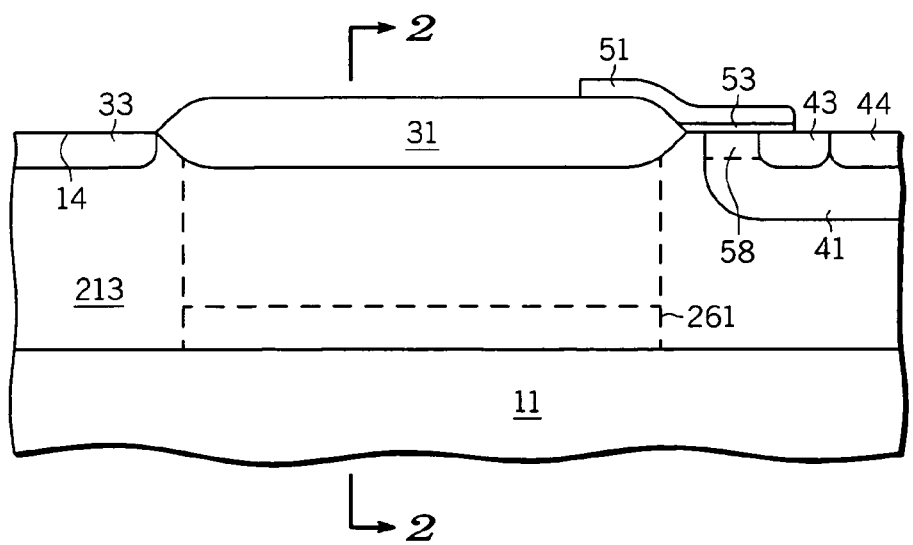
FIG. 10 illustrates an enlarged partial cross-sectional view of a semiconductor device in accordance with a different embodiment the present invention.

FIG. 10 shows a partial cross-sectional view of an insulated gate field effect transistor (IGFET), lateral FET, lateral MOSFET, semiconductor or switching device, structure, or cell 210 having improved $R_{ON}$*Area performance and a high blocking voltage capability in accordance with another embodiment of the present invention. By way of example, MOSFET cell 210 is among many such cells integrated into a semiconductor chip as part of a power integrated circuit. Alternatively, MOSFET cell 210 is a single discrete transistor.

Device 210 is similar to device 10 except that drift or extended drain region 213 comprises an epitaxial layer formed over substrate 11, or comprises a diffused well region that extends underneath body region 41 as shown in FIG. 10. Alternatively, when region 213 comprises a diffused region or well, it terminates underneath body region 41 or as shown in FIG. 1 as region 13. One benefit of using epitaxial growth to form region 213 is to provide a layer or region that is thicker and that has a more controlled doping concentration profile compared to a diffused well or region. With a thicker region and controlled concentration, one can use deeper trenches, which provides a lower on-resistance. By way of example, substrate 11 comprises a p-type substrate having a doping concentration on the order of about $1.5 \times 10^{14}$ atoms/cm$^3$, and region 213 has a charge concentration on the order of about $0.2 \times 10^{12}$ atoms/cm$^2$ to about $1.0 \times 10^{12}$ atoms/cm$^2$ below the super junction structure.

In accordance with this embodiment of the present invention, device 210 further includes a region or super junction structure 261, which comprises a pair, plurality or multiplicity of spaced apart filled trenches or filled striped trenches or grooves bounding in part a plurality or multiplicity of striped doped regions having opposite or alternating conductivity types formed in a portion of well region 213 between and around the filled trenches. In one embodiment, the filled trenches and the striped doped regions are substantially parallel to each other. Region 261 provides, among other things, device 210 with low on-resistance while maintaining a high breakdown voltage. Various embodiments for regions 261 will now be described in conjunction with FIGS. 11 and 12.

Figure 11:
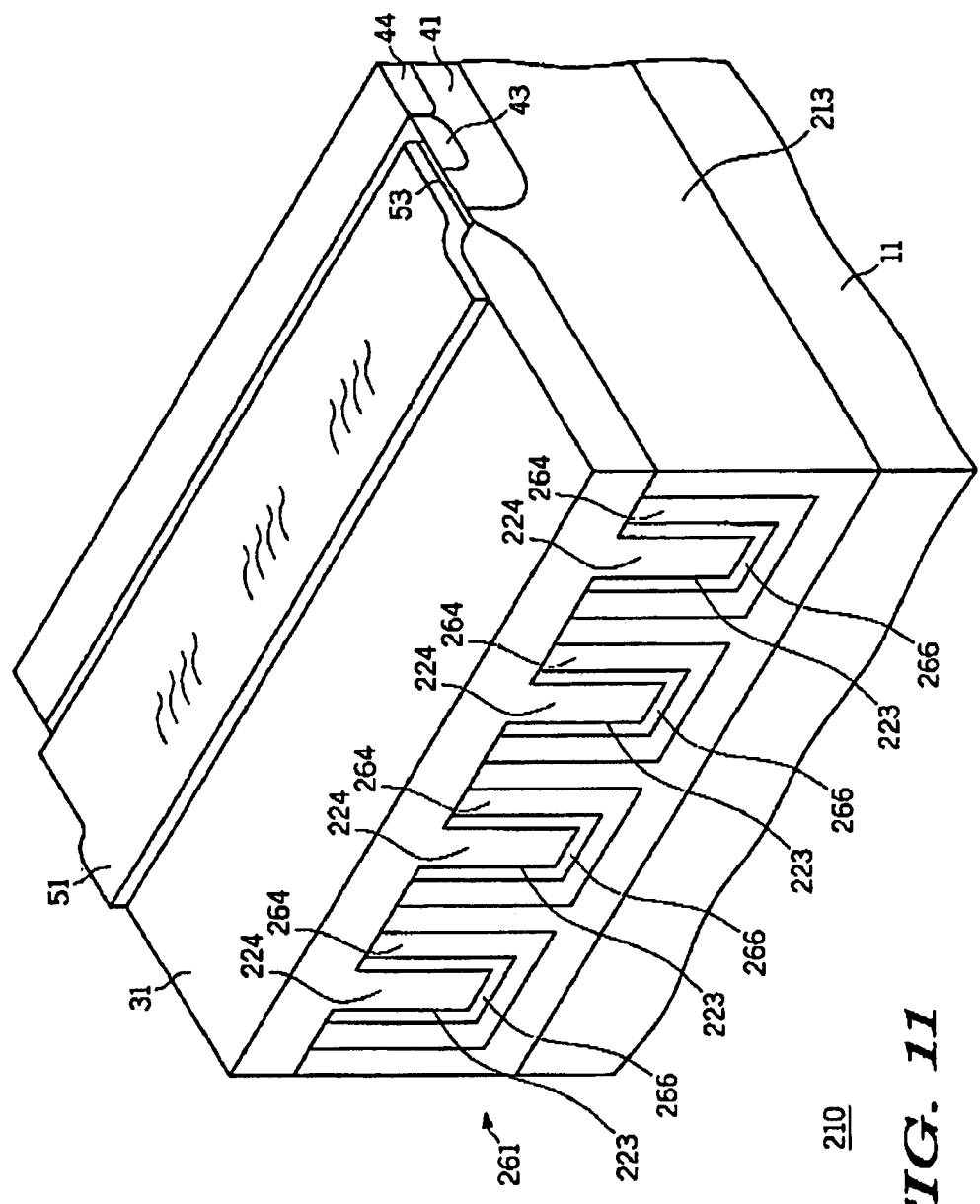
FIG. 11 illustrates an enlarged partial isometric and cross-sectional view of a portion of the semiconductor device of FIG. 10 in accordance with a first embodiment taken along reference line 2-2.

FIG. 11 shows an enlarged partial isometric and cross-sectional view of a portion of the semiconductor device 210 taken along reference line 2-2 to illustrate a first embodiment of region 261 in accordance with the present invention. In this embodiment, region 261 comprises a plurality or trenches 223 formed in region 213 and extending into region 213. Trenches 223 are spaced apart and run the transverse direction between regions 41 and 33, and have a typical depth less than or equal to the depth or thickness of region 213. Drain contact region 33 is one side of super junction region 261, and a body region 41 is on a opposite of super junction region 261. First conductivity type or n-type regions 264 are formed in region 213 through sidewall and bottom or lower surfaces of trenches 223, and second conductivity type or p-type regions 266 are formed in region 213 through the same sidewall and bottom or lower surfaces. In this embodiment, regions 264 and 266 surround, wrap entirely around, or are formed around trenches 223 with regions 264 terminating at a depth less than the depth of region 213. That is, regions 264 are spaced apart from substrate 11. Additionally, regions 264 and 266 are along the depth and length of drift region 213. By way of example, both n-type regions 264 and p-type regions 266 have a peak doping concentration on the order of about $1.0 \times 10^{16}$ atoms/cm$^3$ to $3.0 \times 10^{16}$ atoms/cm$^3$.

By way of example, regions 264 and 266 are formed using angled ion implantation, gas phase doping, or solid source doping. By way of further example, regions 264 and 266 are formed using angled ion implantation with doses on the order of about $2.0 \times 10^{13}$ to about $5.0 \times 10^{13}$ atoms/cm$^2$. By way of still further example, regions 264 and 266 are formed using angled ion implantation with doses on the order of about $2.5 \times 10^{13}$ to about $4.5 \times 10^{13}$ atoms/cm$^2$ when the distance between adjacent trenches is about 5 to 7 microns. In one example, regions 264 are diffused after ion implantation for about 30 minutes at 1200 degrees Celsius. The ion implant step for 266 is then done, and regions 266 may be diffused at the same time as body region 41.

Regions 264 and 266 form a self compensating super junction structure around trenches 223 and function, among other things, to minimize charge influence from those portions of region 213 between and below trenches 223. Also, because regions 264 and 266 wrap around the bottom surfaces of trenches 223, additional current paths are provided as well as the current paths along the sidewalls of trenches 223, which reduces on resistance. Additionally, because the doping concentration of region 213 is much less than regions 264, premature breakdown issues typically occurring between the n-type well region and the p-type body region are reduced.

In a subsequent step, trenches 223 are filled with a material or dielectric material 224 such as an oxide (thermal, deposited, or spin-on for example), a nitride, semi-insulating polycrystalline silicon (SIPOS), undoped polycrystalline semiconductor material (e.g., polysilicon), combinations thereof, or the like.

Figure 12:
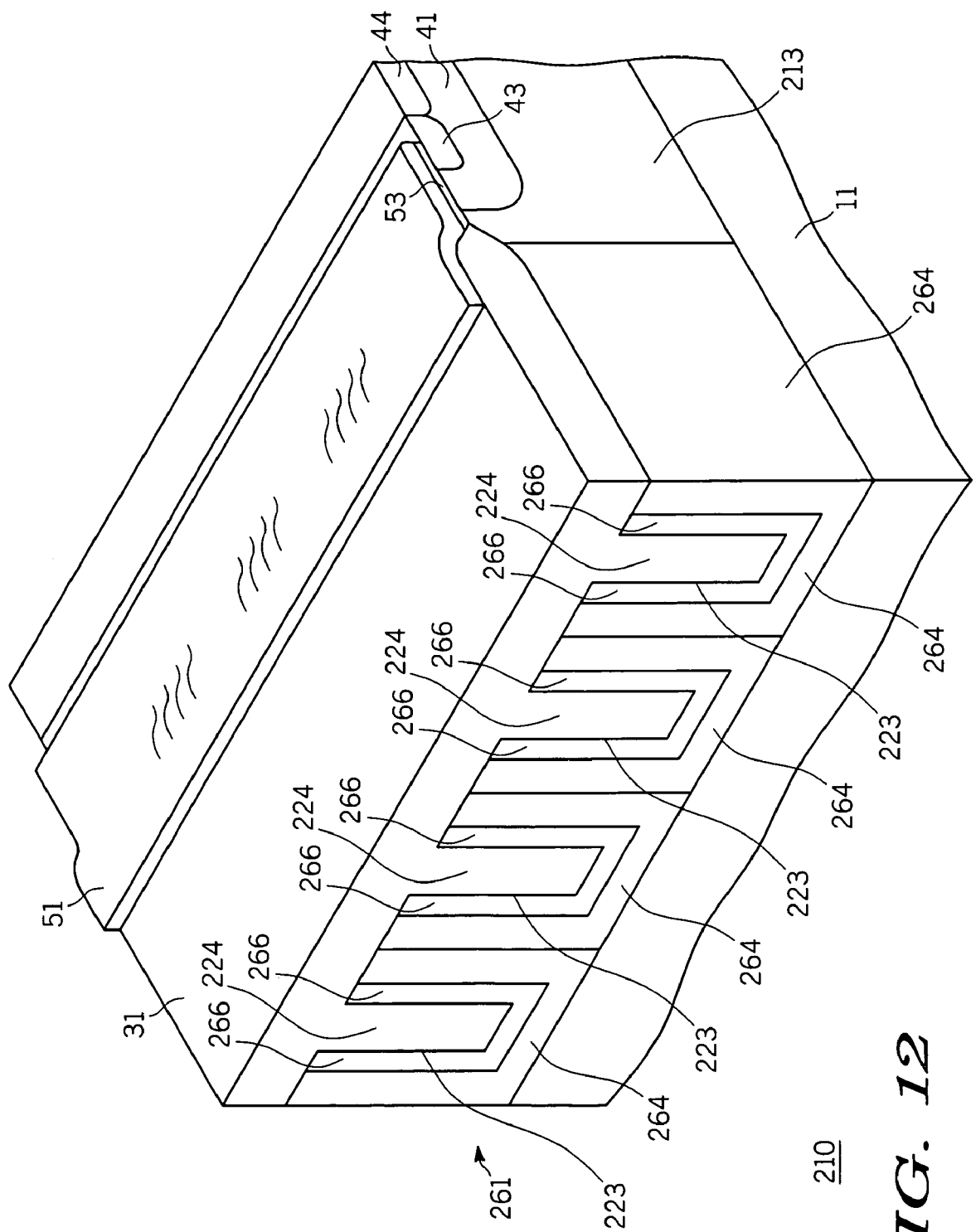
FIG. 12 illustrates an enlarged partial isometric and cross-sectional view of a portion of the semiconductor device of FIG. 10 in accordance with a second embodiment taken along reference line 2-2.

FIG. 12 shows an enlarged partial isometric and cross-sectional view of a portion of the semiconductor device 210 taken along reference line 2-2 to illustrate a second embodiment of region 261 in accordance with the present invention. In this embodiment, regions 264 are diffused to extend through region 213 to contact substrate 11, and/or to merge together with adjoining 264 regions.

Device 210 shown in FIGS. 11 and 12 may further incorporate trench gate structure 105 shown in FIG. 9 with the placement of regions 43 and 44 modified, for example, as further shown in FIG. 9. Additionally, in both embodiments shown, region 261 is spaced apart from body region 41. By way of example, region 261 is spaced a distance on the order of about 1 to 4 microns.

Figure 13:
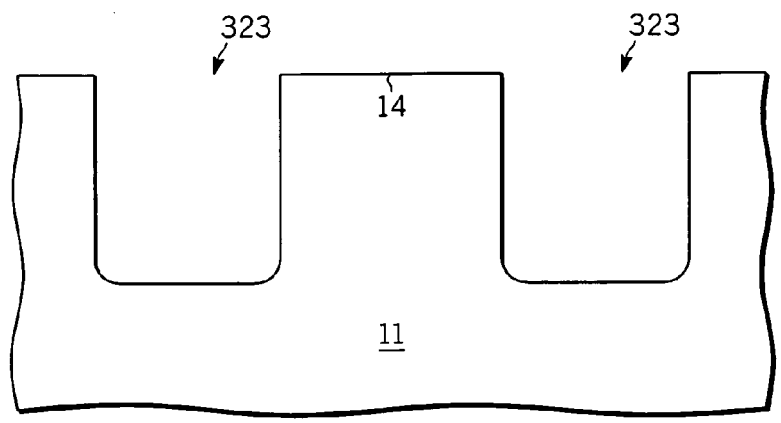
FIGS. 13-18 illustrate enlarged partial cross-sectional views of a portion of a semiconductor device formed in accordance with a method of the present invention at various stages of manufacture.

Turning now to FIGS. 13-19, an alternative method for forming the super junction devices of the present invention is described. FIG. 13 shows a partial cross sectional view of substrate 11 an early step in fabrication. In this embodiment, substrate 11 comprises a p-type conductivity. Next, a trenches or grooves 323 are etched in substrate 11 extending from major surface 14. Conventional masking and etching technique are used for this step.

Figure 14:
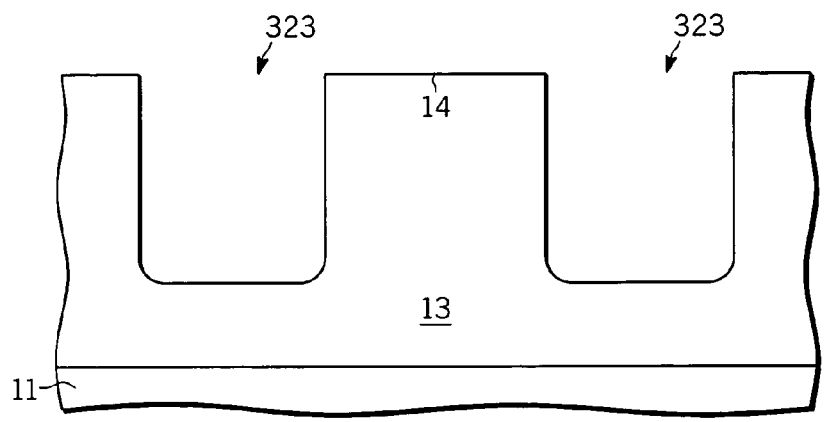

FIG. 14 shows substrate 11 at additional processing where well region 13 is formed in substrate 11 through the surfaces of trenches 323. By way of example, n-type dopant is implanted into the surfaces and diffused to a desire depth. Alternatively, gas phase or solid source doping techniques are used.

Figure 15:
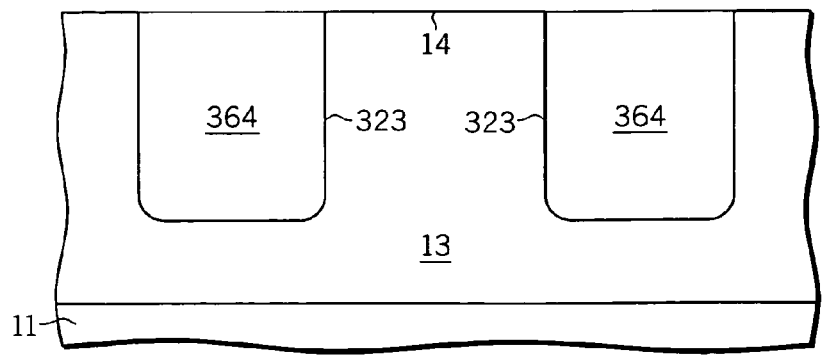
Figure 16:
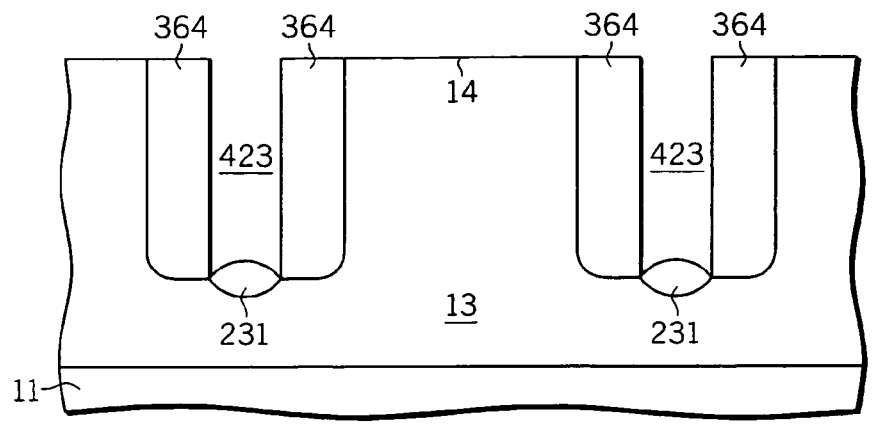

FIG. 15 shows substrate 11 after further processing. At the stage, epitaxial growth/etch back or selective epitaxial growth techniques are used to form n-type striped regions or n-type epitaxial regions 364, which fill trenches 323. Next second trenches 423 are formed in substrate 11 within epitaxial regions 364. In one embodiment, trenches 423 extend through regions 364 to expose portions of well region 13. In an alternative embodiment, which will be explained in more detail below, trenches 423 do not extend all the way through regions 364. Next, localized regions of passivation 231 are formed as described in conjunction with FIG. 3 at the bottom or lower surfaces of trenches 423 as shown in FIG. 16.

Figure 17:
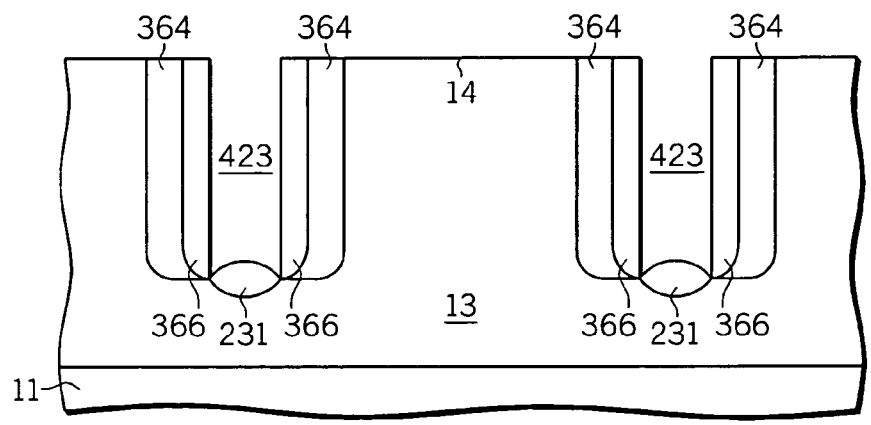
Figure 18:
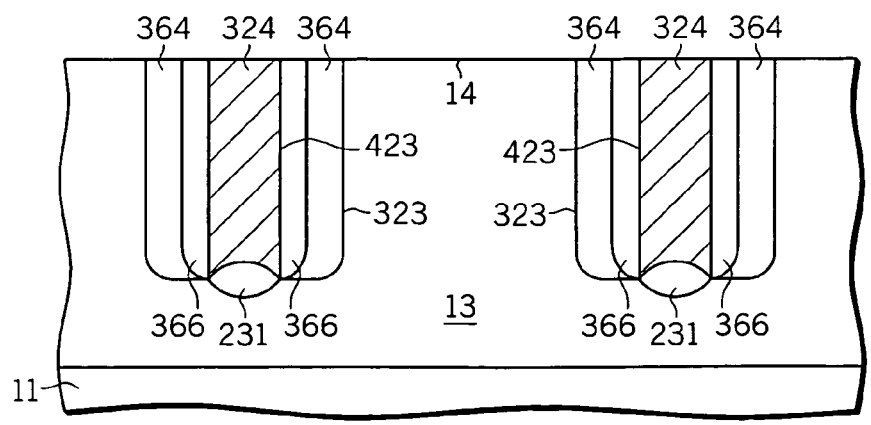

FIG. 17 shows substrate 11 after still further processing where p-type striped regions 366 are formed in the sidewalls of trenches 423. Regions 231 mask the dopant at the bottom or lower surfaces of trenches 423. By way of example, angled ion implantation is used to form regions 366. Alternatively, gas phase or solid source doping techniques are used. In a further step, trenches 423 are filled with a an oxide (thermal, deposited, or spin-on for example), a nitride, semi-insulating polycrystalline silicon (SIPOS), undoped polycrystalline semiconductor material (e.g., polysilicon), combinations thereof, or the like as shown in FIG. 18 to provide a super junction structure where n-type regions 364 and p-type regions 365 do not wrap entirely around trenches 423. Regions 231 are either left in place or removed before filling trenches 423. In an alternative embodiment, regions 364 are merged together within well region 13.

Figure 19:
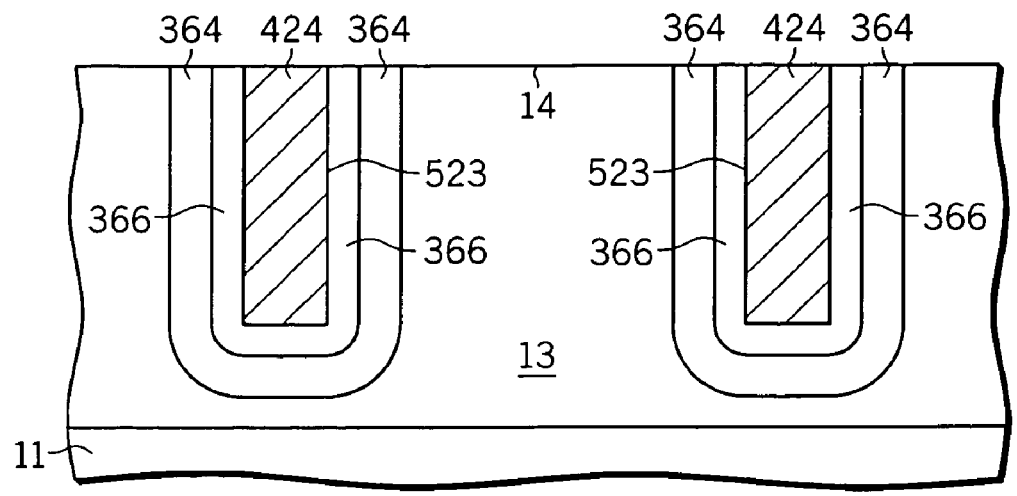
FIG. 19 illustrates an enlarged partial cross-section view of a portion of another semiconductor device formed in accordance with an alternative method of manufacture.

FIG. 19 shows a cross sectional view of alternative embodiment where trenches 523 are formed in epitaxial regions 364, but do not extend all the way through regions 364. P-type dopant is introduced in the sidewalls and bottom or lower surfaces of trenches 523 to provide a super junction structure where n-type regions 364 and p-type regions 366 wrap entirely around trenches 523. In subsequent step, trenches 523 are filled with material 424. In an alternative embodiment, regions 364 are merged together within well region 13.

Figure 20:
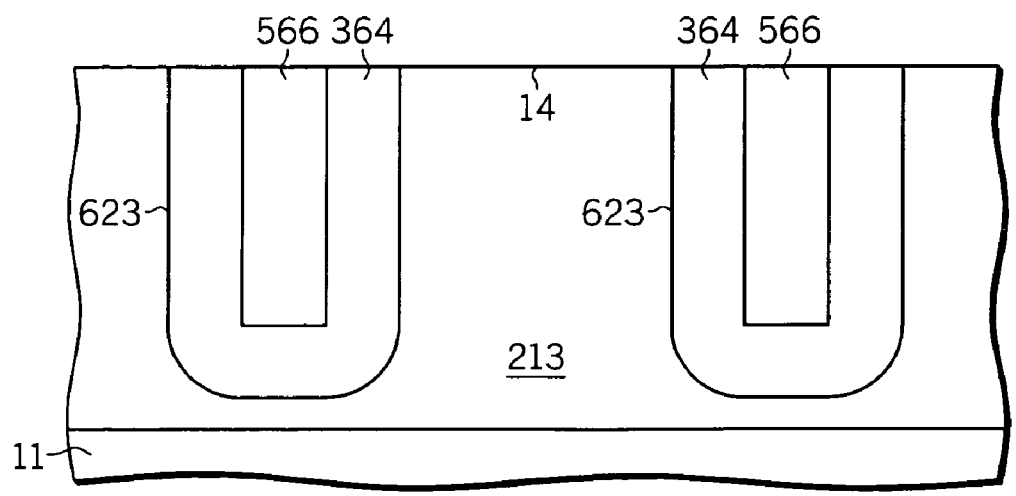
FIG. 20 illustrates an enlarged partial cross-sectional view of a portion of another semiconductor device in accordance with the present invention.

FIG. 20 shows a cross-sectional view of a super junction structure 361 in accordance with another embodiment of the present invention for use in place of structure 61 in device 10 or structure 261 in device 210. Structure 361 includes a plurality of filled trenches 623 formed in drift, well, or epitaxial region 213. Filled trenches 623 each comprise an n-type doped region 364 filling a portion of trenches 623 or formed over sidewall and lower surfaces of trenches 623, and a p-type doped region 566 formed over region 364. In one embodiment, region 566 fills the remaining portion of filled trenches 623. Structure 361 is formed, for example, using the etch/epitaxial growth method described in conjunction with FIGS. 13-15. An additional trench is then formed in each of the regions 364, and then a p-type epitaxial layer is formed over the structure with any excess material removed to provide regions 566 and the resultant structure 361 shown in FIG. 20.

Thus it is apparent that there has been provided, in accordance with the present invention, a lateral FET structure having improved blocking voltage and specific on-resistance performance. The structure incorporates a super junction structure comprising a plurality (at least a pair) or multiplicity of spaced apart filled trenches or filled striped trenches or grooves bounding or confining at least in part a plurality or multiplicity of striped doped regions having opposite or alternating conductivity types formed in the well or drift region.

Although the invention has been described and illustrated with reference to specific embodiments thereof, it is not intended that the invention be limited to these illustrative embodiments. For example, more filled trenches may be used including trenches having rounded corners or rounded bottom surfaces. Additionally, combinations of the fill materials disclosed may be used including oxide/nitride, oxide/SIPOS, oxide/polysilicon, oxide/nitride/oxide, combinations thereof, or the like. Those skilled in the art will recognize that modifications and variations can be made without departing from the spirit of the invention. Therefore, it is intended that this invention encompass all such variations and modifications as fall within the scope of the appended claims.

We claim:

1. A lateral IGFET device comprising:
a semiconductor substrate;
a first region of a first conductivity type formed as part of the semiconductor substrate, wherein the semiconductor substrate and the first region are in physical contact without an intervening insulating layer between them;
a body region of a second conductivity type formed in the semiconductor substrate adjacent the first region;
a source region of the first conductivity type formed in the body region;
a drain contact region of the first conductivity type formed in the first region to provide a lateral IGFET device configuration;
a gate structure formed adjacent to the body region; and
a super junction structure formed in the first region and laterally spaced apart from the body region so that a portion of the first region is between the super junction structure and the body region, the super junction structure including a pair of spaced apart filled striped trenches, a first striped doped region of the first conductivity type and a second striped doped region of the second conductivity type between the pair of spaced apart filled striped trenches, wherein the first striped doped region has a higher doping concentration than the first region, and wherein the pair of spaced apart filled striped trenches terminate within the first region thereby leaving another portion of the first region between lower surfaces of the pair of spaced apart filled striped trenches and the substrate, and wherein the first and second striped doped regions do not wrap entirely around the lower surfaces of the pair of spaced apart filled striped trenches.

2. The device of claim 1 wherein the pair of spaced apart filled striped trenches and the first and second striped doped region terminate at a depth in the first region that is substantially equal.

3. The device of claim 1 wherein the pair of spaced apart filled striped trenches comprises trenches filled with a dielectric material extending to a major surface of the semiconductor substrate.

4. The device of claim 1 further comprising a third striped doped region of the first conductivity type between the pair of spaced apart filled striped trenches.

5. The device of claim 1 further comprising a third striped doped region of the second conductivity type between the pair of spaced apart filled striped trenches.

6. The device of claim 1, wherein the gate structure comprises a planar gate structure, the device further comprising a trench gate structure formed adjacent the body region.

7. The device of claim 1, wherein the super junction structure consists of the first doped striped region formed adjoining one of the pair striped filled trenches and the second doped striped region formed adjoining another of the pair of striped filled trenches, and wherein first doped striped region adjoins the second doped striped region.

8. The device of claim 1 further comprising an insulating layer formed in the semiconductor substrate adjacent lower surfaces of the pair of filled striped trenches, wherein the insulating layer is confined within first region so that the insulating layer does not underlie the body region.

9. The device of claim 1, wherein the pair of striped filled trenches are formed with a dielectric material and SIPOS.

10. The device of claim 1 further comprising a first localized dielectric region formed in the semiconductor substrate and confined below the lower surface of one of the pair of filled striped trenches, wherein the first localized dielectric region is further confined within the first region and spaced apart from the substrate.

11. The device of claim 10 further comprising a second localized dielectric region formed in the semiconductor substrate and confined below the lower surface of another of the pair of filled striped trenches, wherein a portion of the first region laterally separates the first and second localized dielectric regions, and wherein the second localized dielectric region is further confined within the first region and spaced apart from the substrate.

12. A lateral IGFET device comprising:
a first region of a first conductivity type formed as part of a second conductivity type semiconductor substrate;
a body region of the second conductivity type formed in the semiconductor substrate adjacent the first region;
a source region of the first conductivity type formed in the body region;
a drain contact region of the first conductivity type formed in the first region;
a gate structure formed adjacent to the body region; and
a super junction structure formed in the first region, the super junction structure including:
a pair of spaced apart insulated trenches, wherein the pair of spaced apart insulated trenches has bottom surfaces that terminate within the first region;
a first localized insulating region formed confined along the bottom surface of a first insulated trench;
a second localized insulating region separate and distinct from the first localized insulating region formed confined along the bottom surface of a second insulated trench, wherein the first and second localized insulating regions are confined within the first region and separated from the semiconductor substrate by the first region;
a first striped doped region of the first conductivity type formed between the pair of spaced apart insulated trenches; and
a second striped doped region of the second conductivity type formed between the pair of spaced apart insulated trenches, wherein the first and second striped doped regions terminate in the first region without wrapping entirely around the bottom surfaces of the first and second insulated trenches.

13. The device of claim 12 further comprising a third striped doped region of the first conductivity type between the pair of spaced apart insulated trenches, wherein the third doped region terminates in the first region without wrapping entirely around the bottom surfaces.

14. The device of claim 12 further comprising a third striped doped region of the second conductivity type between the pair of spaced apart insulated trenches, wherein the third doped region terminates in the first region without wrapping entirely around the bottom surfaces.

15. The device of claim 12, wherein the gate structure comprises a planar gate structure, the device further comprising a trench gate structure formed adjacent the body region.

* * * * *